United States Patent [19]
Rozman et al.

[11] Patent Number: 5,572,707
[45] Date of Patent: Nov. 5, 1996

[54] NONVOLATILE MEMORY WITH A PROGRAMMABLE CONFIGURATION CELL AND A CONFIGURATION LOGIC FOR TEMPORARILY RECONFIGURING THE MEMORY WITHOUT ALTERING THE PROGRAMMED STATE OF THE CONFIGURATION CELL

[75] Inventors: Rodney R. Rozman, Placerville; Michael P. Vital, Orangevale; Peter K. Hazen, Auburn, all of Calif.

[73] Assignee: Intel Corporation, Santa Clara, Calif.

[21] Appl. No.: 520,867

[22] Filed: Aug. 22, 1995

Related U.S. Application Data

[63] Continuation of Ser. No. 68,641, May 27, 1993, abandoned.
[51] Int. Cl.⁶ .................................................... G06F 12/00
[52] U.S. Cl. ............... 395/497.01; 395/430; 395/183.06; 395/429; 326/38; 364/DIG. 1; 364/244.6; 364/244.9; 364/259.1
[58] Field of Search ...................... 395/427, 428, 395/429, 430, 183.01, 183.08, 183.06; 365/185.14, 900; 326/38, 41, 39, 37

[56] References Cited

U.S. PATENT DOCUMENTS

| | | | |
|---|---|---|---|
| 4,752,871 | 6/1988 | Sparks et al. | 395/800 |
| 4,940,909 | 7/1990 | Mulder et al. | 307/465 |
| 5,099,453 | 3/1992 | Steele | 365/229 |
| 5,361,373 | 11/1994 | Gilson | 395/800 |

*Primary Examiner*—Eddie P. Chan
*Assistant Examiner*—Hiep T. Nguyen
*Attorney, Agent, or Firm*—Blakely, Sokoloff, Taylor & Zafman

[57] ABSTRACT

A nonvolatile memory includes a memory array, control circuitry coupled to the memory array for controlling memory operations with respect to the memory array, and a configuration cell coupled to the control circuitry for generating a configuration signal to configure the nonvolatile memory with respect to the memory operations. The configuration cell can be programmed in a first state and a second state. A configuration logic is coupled to the configuration cell and the control circuitry for altering the configuration signal from the configuration cell to the control circuitry without causing the configuration cell to be reprogrammed. The configuration logic includes an exclusive or gate that temporarily alters the configuration signal without affecting a programmed state of the configuration cell. The configuration logic can also disable the configuration signal to the control circuitry and configure the nonvolatile memory with a temporary configuration information stored in a configuration register of the configuration logic.

3 Claims, 3 Drawing Sheets

| DISXOR | ALAT | CONFIG | ARCHCON |
|--------|------|--------|---------|
| 0 | 0 | 0 | 0 |
| 0 | 0 | 1 | 1 |
| 0 | 1 | 0 | 1 |
| 0 | 1 | 1 | 0 |
| 1 | 0 | 0 | 0 |
| 1 | 0 | 1 | 0 |
| 1 | 1 | 0 | 1 |
| 1 | 1 | 1 | 1 |

Figure 3

NONVOLATILE MEMORY WITH A PROGRAMMABLE CONFIGURATION CELL AND A CONFIGURATION LOGIC FOR TEMPORARILY RECONFIGURING THE MEMORY WITHOUT ALTERING THE PROGRAMMED STATE OF THE CONFIGURATION CELL

This is a continuation of application Ser. No. 08/068,641, filed May 27, 1993, now abandoned.

FIELD OF THE INVENTION

The present invention pertains to the field of computer memories. More particularly, this invention relates to a nonvolatile memory that includes a configuration logic that can configure and temporarily reconfigure the nonvolatile memory.

BACKGROUND OF THE INVENTION

One type of flash erasable and electrically programmable read-only memory ("flash EPROM") is organized into rows and columns. Memory cells are placed at intersections of word lines and bit lines. Each word line is connected to the gates of a plurality of memory cells in one row. Each bit line is connected to the drains of a plurality of memory cells in one column. The prior flash EPROM can be programmed, and once programmed, the entire contents of the prior flash EPROM can be erased by electrical erasure. The prior flash EPROM may then be reprogrammed with new data.

One type of prior flash EPROM typically includes content addressable memory ("CAM") cells in addition to a main memory array. The CAM cells are typically used to perform certain configuration and management functions for the prior flash EPROM. The CAM cells typically comprise flash EPROM cells. The CAM cells can be programmed to configure the prior flash EPROM with respect to device operations (for example, data widths, latched inputs, the chip enable signal CEBTTL active high, the output enable signal OEBTTL active high, etc.). The CAM cells can also be used to activate (or deactivate) redundancy cells and reference cells with respect to the main memory array. The redundancy cells are used in place of defective cells of the main memory array. The CAM cells are programmed with the configuration information before the prior flash EPROM reaches the end user as a final product. Before the prior flash EPROM is shipped by the manufacture, a series of tests are conducted to determine whether the prior flash EPROM meets its device specifications. Typically, the tests involve testing different device configurations.

One disadvantage associated with this prior flash EPROM is that during testing of the prior flash EPROM, the CAM cells that store the configuration information of the prior flash EPROM need to be reprogrammed with various device configuration information for the testing. For example, when the prior flash EPROM can be configured as a byte wide flash EPROM or as a word wide flash EPROM and when a CAM cell is used to configure the prior flash EPROM with a byte wide data width, the CAM cell is first programmed with byte wide data width configuration information and the prior flash EPROM is then configured accordingly. During testing, however, the prior flash EPROM needs to be also tested under the word wide data width architecture. When this occurs, the CAM cell that stores the byte wide data width configuration information needs to be reprogrammed with the word wide data width configuration information. Typically, programming a CAM cell takes more time than just writing to a volatile register. When the prior flash EPROM is repeatedly tested between the word wide data width architecture and the byte wide data width architecture, the CAM cell needs to be repeatedly reprogrammed. This typically causes the test of the prior flash EPROM to be relatively long.

Moreover, because programming and reprogramming of a CAM cell typically requires additional external circuitry, it is typically very inconvenient and costly to repeatedly reprogram the CAM cell.

SUMMARY AND OBJECTS OF THE INVENTION

One of the objects of the present invention is to provide a nonvolatile memory that allows efficient testing of different device configurations at any time.

Another object of the present invention is to provide a nonvolatile memory the architecture of which can be temporarily or permanently programmed and altered after fabrication of the nonvolatile memory.

Another object of the present invention is to provide a nonvolatile memory with a configuration logic that can temporarily and permanently configure and reconfigure the nonvolatile memory.

A further object of the present invention is to provide a nonvolatile memory with a configuration logic that can temporarily alter the device configuration information stored in the CAMs of the nonvolatile memory without reprogramming the CAMs.

A nonvolatile memory includes a memory array, control circuitry coupled to the memory array for controlling memory operations with respect to the memory array, and a configuration cell coupled to the control circuitry for generating a configuration signal to configure the nonvolatile memory with respect to the memory operations. The configuration cell can be programmed in a first state and a second state. A configuration logic is coupled to the configuration cell and the control circuitry for altering the configuration signal from the configuration cell to the control circuitry without causing the configuration cell to be reprogrammed. The configuration logic temporarily alters the configuration signal without affecting a programmed state of the configuration cell.

A nonvolatile memory includes a memory array, control circuitry coupled to the memory array for controlling memory operations with respect to the memory array, and a configuration cell coupled to the control circuitry for generating a configuration signal to configure the nonvolatile memory with respect to the memory operations. The configuration cell can be programmed in a first state and a second state. A configuration logic includes a configuration register and is coupled to the configuration cell and the control circuitry for disabling the configuration signal from the configuration cell to the control circuitry, and for configuring the nonvolatile memory with a temporary configuration information stored in the configuration register. The configuration register is a volatile register and can be in a third state and a fourth state.

Other objects, features, and advantages of the present invention will be apparent from the accompanying drawings and from the detailed description that follows below.

BRIEF DESCRIPTION OF THE DRAWINGS

The present invention is illustrated by way of example and not limitation in the figures of the accompanying drawings, in which like references indicate similar elements and in which:

FIG. 3 is a logic table showing the relation of the the disable signal DISXOR, the test configuration alteration signal ALAT, the configuration signal CONFIG, and the architecture configuration signal ARCHCON signals illustrated in FIG. 2.

DETAILED DESCRIPTION

Figure 1:
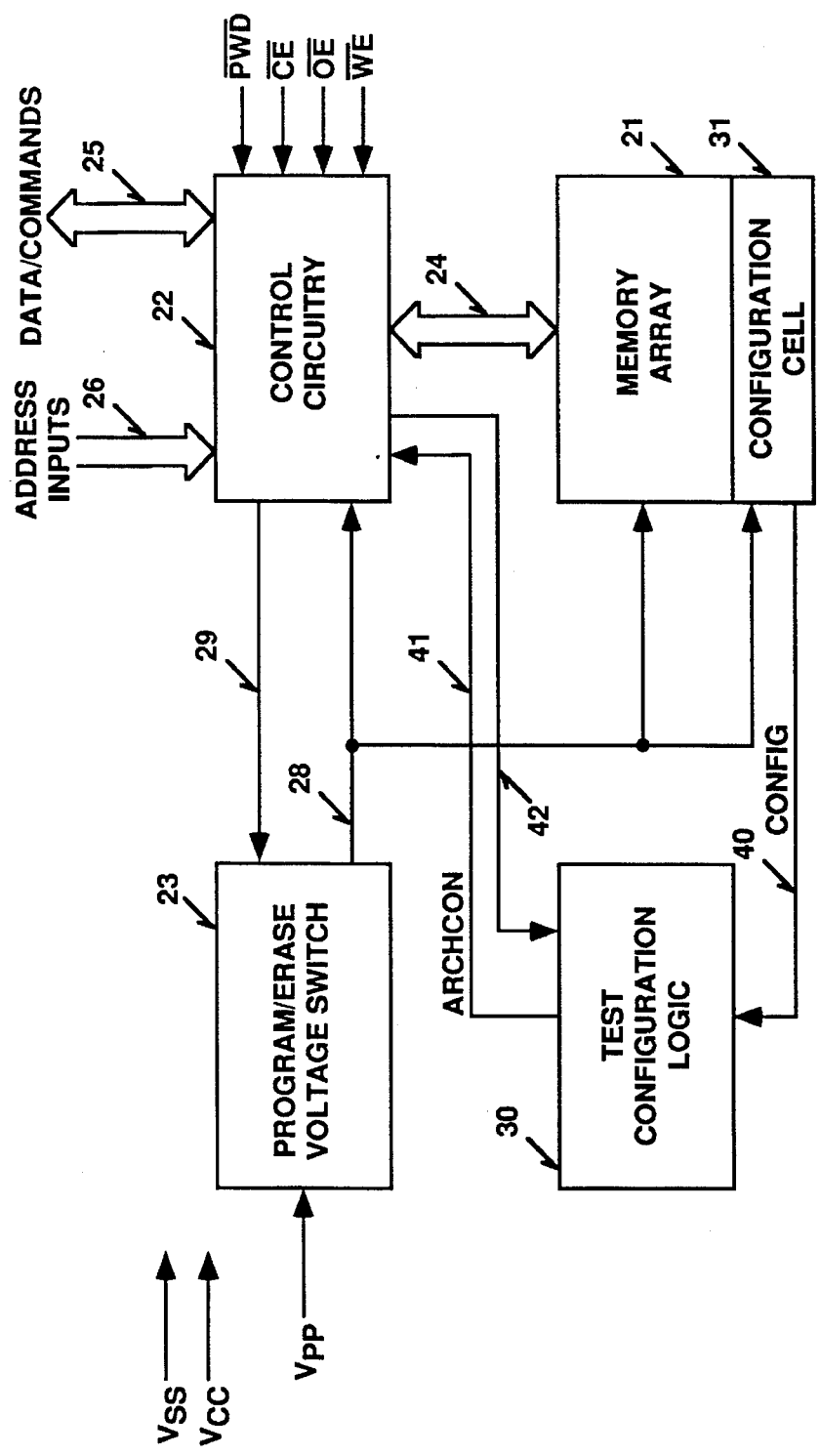
FIG. 1 is a block diagram of a flash EPROM, including a configuration cell, a test configuration logic, and a control circuitry.

FIG. 1 schematically illustrates in block diagram form the circuitry of flash EPROM 20, which implements an embodiment of the present invention. Flash EPROM 20 includes a memory array 21, control circuitry 22 for controlling the operation of memory array 21, and a program/erase voltage switch 23 for applying a program/erase voltage $V_{PP}$ to memory array 21 and control circuitry 22.

Flash EPROM 20 also includes a configuration cell 31 and a test configuration logic 30. Configuration cell 31 is used to store configuration information of flash EPROM 20 and to configure flash EPROM 20 in accordance with the configuration information stored in configuration cell 31. Test configuration logic 30 is used to temporarily alter or negate the configuration information stored in configuration cell 31 during testing of flash EPROM 20. In FIG. 1, only one configuration cell 31 and one test configuration logic 30 is shown for flash EPROM 20 for illustration purposes. In practice, many more configuration cells are provided for flash EPROM 20, each being coupled to control circuitry 22 of flash EPROM 20 via a test configuration logic similar to that of test configuration logic 30. The circuitry of test configuration logic 30 will be described below, in conjunction with FIGS. 2–3.

As will be described in more detail below, flash EPROM 20 can be temporarily and permanently programmed to have different device configurations without affecting the configuration information stored in configuration cell 31.

Referring to FIG. 1, memory array 21 of flash EPROM 20 is made up of memory cells that store data at addresses. For one embodiment, memory array 21 stores 4 Mbits ("megabits") of data. For another embodiment, memory array 21 stores 8 Mbits of data. For alternative embodiments, memory array 21 can be smaller than 4 Mbits or larger than 8 Mbits.

For one embodiment, memory array 21 is organized into bit line blocks by arranging bit lines into groups. For another embodiment, memory array 21 is organized into word line blocks by arranging word lines into groups.

For one embodiment, all the circuitry of flash EPROM 20 on a single substrate and flash EPROM 20 employs MOS circuitry.

Control circuitry 22 of flash EPROM 20 controls the device operations with respect to memory array 21 via bus 24. The device operations typically include read, programming, and erasure operation. Control circuitry 22 also receives data read from memory array 21 and applies data to be written to memory array 21 via bus 24. Control circuitry 22 also provides the configuration signals and other control signals to memory array 21 via bus 24. Control circuitry 22 includes address decoding circuitry, write state circuitry, and command state circuitry (not shown). The address decoding circuitry of control circuitry 22 accesses the memory locations of memory array 21 at the addresses supplied to flash EPROM 20. The write state circuitry regulates the device operations of flash EPROM 20 after an initiating command from an external CPU. The command is applied to the command state circuitry. The command state circuitry decodes the command and generates the appropriate control signals to the write state circuitry.

Control circuitry 22 also includes various configuration circuits that can configure flash EPROM 20 with various architectures in accordance with the configuration information stored in configuration cells, like configuration cell 31, of flash EPROM 20. Moreover, the various configuration circuits also configure flash EPROM 20 with respect to device operations of flash EPROM 20. For example, the various configuration circuits of control circuitry 22 may include a data width configuration logic that configures flash EPROM 20 into either a byte wide flash EPROM or a word wide flash EPROM.

Addresses are applied to flash EPROM 20 via address bus 26. Data is applied to and received from flash EPROM 20 via data bus 25. The device operation commands are also applied to flash EPROM 20 via data bus 25.

$V_{PP}$ is the program/erase power supply voltage for flash EPROM 20. $V_{PP}$ is applied to a $V_{PP}$ pin of flash EPROM 20. $V_{PP}$ is coupled to program/erase voltage switch 23. During programming and erasing of flash EPROM 20, program/erase voltage switch 23 passes the $V_{PP}$ potential to memory array 21 and control circuitry 22. For one embodiment, $V_{PP}$ is approximately 12 volts.

$V_{CC}$ is the device power supply for flash EPROM 20 and $V_{SS}$ is ground. $V_{CC}$ is applied to a $V_{CC}$ pin of flash EPROM 20 and $V_{SS}$ is applied to a $V_{SS}$ pin of flash EPROM 20. For one embodiment, $V_{CC}$ is approximately 3 volts. For another embodiment, $V_{CC}$ is approximately 5 volts.

Flash EPROM 20 includes three control signals coupled to control circuitry 22—namely, chip enable $\overline{CE}$, output enable $\overline{OE}$, and write enable $\overline{WE}$. Chip enable input $\overline{CE}$ is the power control and is used for device selection of flash EPROM 20. The output enable input $\overline{OE}$ is the output control for flash EPROM 20 and is used to gate data from the output pins from flash EPROM 20, dependent on device selection. Both of the control functions $\overline{CE}$ and $\overline{OE}$ must be logically active to obtain data at the outputs of flash EPROM 20. When the enable pin $\overline{CE}$ is high (at the $V_{CC}$ voltage), flash EPROM 20 enters a standby mode. In the standby mode, power consumption by flash EPROM 20 is reduced.

The write enable signal $\overline{WE}$ allows writes to control circuitry 22 while chip enable input $\overline{CE}$ is active low. Write enable signal $\overline{WE}$ is active low. Addresses and data are latched on the rising edge of the write enable $\overline{WE}$ signal. Standard microprocessor timings are used.

Flash EPROM 20 also includes a $\overline{PWD}$ pin. The $\overline{PWD}$ pin is coupled to control circuitry 22. The $\overline{PWD}$ pin supplies a $\overline{PWD}$ control signal to control circuitry 22. The $\overline{PWD}$ control signal is an active low power down control signal. A logically low $\overline{PWD}$ control signal causes flash EPROM 20 to enter the power down mode. As described above, when flash EPROM 20 enters the power down mode, all circuits of flash EPROM 20 are powered off. When the $\overline{PWD}$ control signal supplied at the $\overline{PWD}$ pin raises to the $V_{CC}$ voltage (i.e., logical high), flash EPROM 20 returns to its normal operational modes.

For an alternative embodiment, the $\overline{PWD}$ control signal applied at the $\overline{PWD}$ pin of flash EPROM 20 may also include a $V_{PP}$ voltage signal (i.e., a high voltage signal).

For alternative embodiments, flash EPROM 20 functions without some of the above-mentioned control signals.

In absence of the high $V_{PP}$ potential on the $V_{PP}$ input pin to flash EPROM 20, EPROM 20 acts as a read-only memory. The data stored at an address supplied via address bus 26 is read from memory array 21 and made available through control circuitry 22 and buses 24 and 25 to the external CPU Device operations of flash EPROM 20, such as read, programming, and erasure, are selected by writing specific commands into control circuitry 22 via data bus 25. The commands may include an erase set-up command, an erase confirm command, a program set-up command, a program command, and a read command. While $V_{PP}$ is high for erasure and programming, memory array 21 can be accessed via the read command as well.

The programming and erasure operations are regulated by the write state circuitry of control circuitry 22 internally, including program pulse repetition where required and internal verification and margin of data. This is also referred to as internal write automation.

Commands to program or erase memory array 21 are applied to control circuitry 22 via data bus 25 and are decoded in control circuitry 22. Control circuitry 22 then latches in the necessary addresses and data needed to complete the operations from address bus 26 and data bus 25, respectively. Control circuitry 22 then controls program/erase voltage switching 23 via line 29 to apply the $V_{PP}$ voltage to memory array 21 via line 28.

Flash EPROM 20 also includes configuration cell 31. Configuration cell 31 is located peripherally to memory array 21. As is described above, flash EPROM 20 includes other configuration cells. These other configuration cells are also located peripherally to memory array 21. FIG. 1 only shows configuration cell 31 for illustration purposes. Similar to configuration cell 31, these other configuration cells store various configuration information of flash EPROM 20.

Configuration cell 31 is a flash EPROM-type cell that can be electrically programmed and erased. Configuration cell 31 is used in flash EPROM 20 to configure flash EPROM 20 with respect to memory operations of flash EPROM 20. For example, configuration cell 31 can be used to configure the data width of flash EPROM 20. As a further example, when configuration cell 31 is in a programmed state, flash EPROM 20 can be configured into a word wide flash EPROM. When configuration cell 31 is in an erased state, flash EPROM 20 can be configured into a byte wide flash EPROM. Configuration cell 31 generates a CONFIG signal. When configuration cell 31 is in an erased state, the CONFIG signal is logically high. When the CONFIG signal is in a programmed state, the CONFIG signal is logically low.

Flash EPROM 20 also includes test configuration logic 30. Test configuration logic 30 receives the CONFIG signal from configuration cell 31. The function of test configuration logic 30 is to temporarily disable the CONFIG signal from configuration cell 31 and to temporarily configure flash EPROM 20 with the content stored in test configuration logic 30.

Test configuration logic 30 outputs an ARCHCON signal. Test configuration logic 30 is also coupled to control circuitry 22 via line 42. The circuit of test configuration logic 30 will be described in more detail below, in conjunction with FIGS. 2–3.

As will be described in more detail below in connection with FIGS. 2–3, test configuration logic 30 includes a configuration register that stores information to temporarily configure flash EPROM 20. Test configuration logic 30 also includes circuitry for disabling the CONFIG signal and coupling the information in the configuration register to become the ARCHCON signal. When test configuration logic 30 does not disable the CONFIG signal, the CONFIG signal can become the ARCHCON signal. For one embodiment, when test configuration logic 30 does not disable the CONFIG signal, the CONFIG signal is exclusive ORed with the configuration information from the configuration register test configuration of logic 30 such that the CONFIG signal can be overwritten or negated by the configuration information in the configuration register of test configuration logic 30 and the configuration of flash EPROM 20 can be temporarily altered in accordance with the information stored in the configuration register of test configuration logic 30 after configuration cell 31 is programmed to store the configuration information.

Test configuration logic 30 receives the configuration information and the information to temporarily disable the CONFIG signal of configuration cell 31 from the input pins of flash EPROM 20 via control circuitry 22 and line 42. Test configuration logic 30 provides increased test capability and flexibility in configuring flash EPROM 20.

Before flash EPROM 20 is finally packaged, configuration cell 31 can be programmed with the configuration information and flash EPROM 20 undergoes different tests during which the architecture of flash EPROM 20 needs to be temporarily altered. Test configuration logic 30 is used at this time to temporarily block the CONFIG signal and configure flash EPROM 20 according to the configuration information stored in test configuration logic 30. In addition, test configuration logic 30 provides the capability of overwriting or negating the CONFIG signal even after configuration cell 31 is programmed with the configuration information. When test configuration logic 30 performs its control function, flash EPROM 20 will be configured under the control of test configuration logic 30 and the ARCHCON no longer follows the CONFIG signal. Functionally speaking, test configuration logic 30 allows the ARCHCON signal to be changed without reprogramming configuration cell 31. In addition, test configuration logic 30 allows the configuration signal CONFIG to be disabled temporarily and causes the ARCHCON signal to follow a temporary configuration information stored in test configuration logic 30.

For example, when configuration cell 31 is used to configure the data width of flash EPROM 20, test configuration logic 30 can be used in flash EPROM 20 to temporarily disable the data width configuration CONFIG signal from configuration cell 31 to control circuitry 22 and to temporarily configure the data width of flash EPROM 20 such that flash EPROM 20 can be tested for different structures during testing of flash EPROM 20. This facilitates a test engineer to test different structures of flash EPROM 20 (e.g., byte wide mode or word wide mode) without reprogramming configuration cell 31. Moreover, even if configuration cell 31 is programmed with the data width configuration information for flash EPROM 20, test configuration logic 30 allows the CONFIG signal to be temporarily overwritten or negated by the temporary data width configuration information stored in the configuration register of test configuration logic 30. Therefore, test configuration logic 30 allows the test engineer to test the architecture of flash EPROM 20 with different data widths before and after configuration cell 31 is programmed with the permanent configuration information. Therefore, test configuration logic 30 offers a flexible test mechanism to simplify the test flows for flash EPROM 20.

Figure 2:
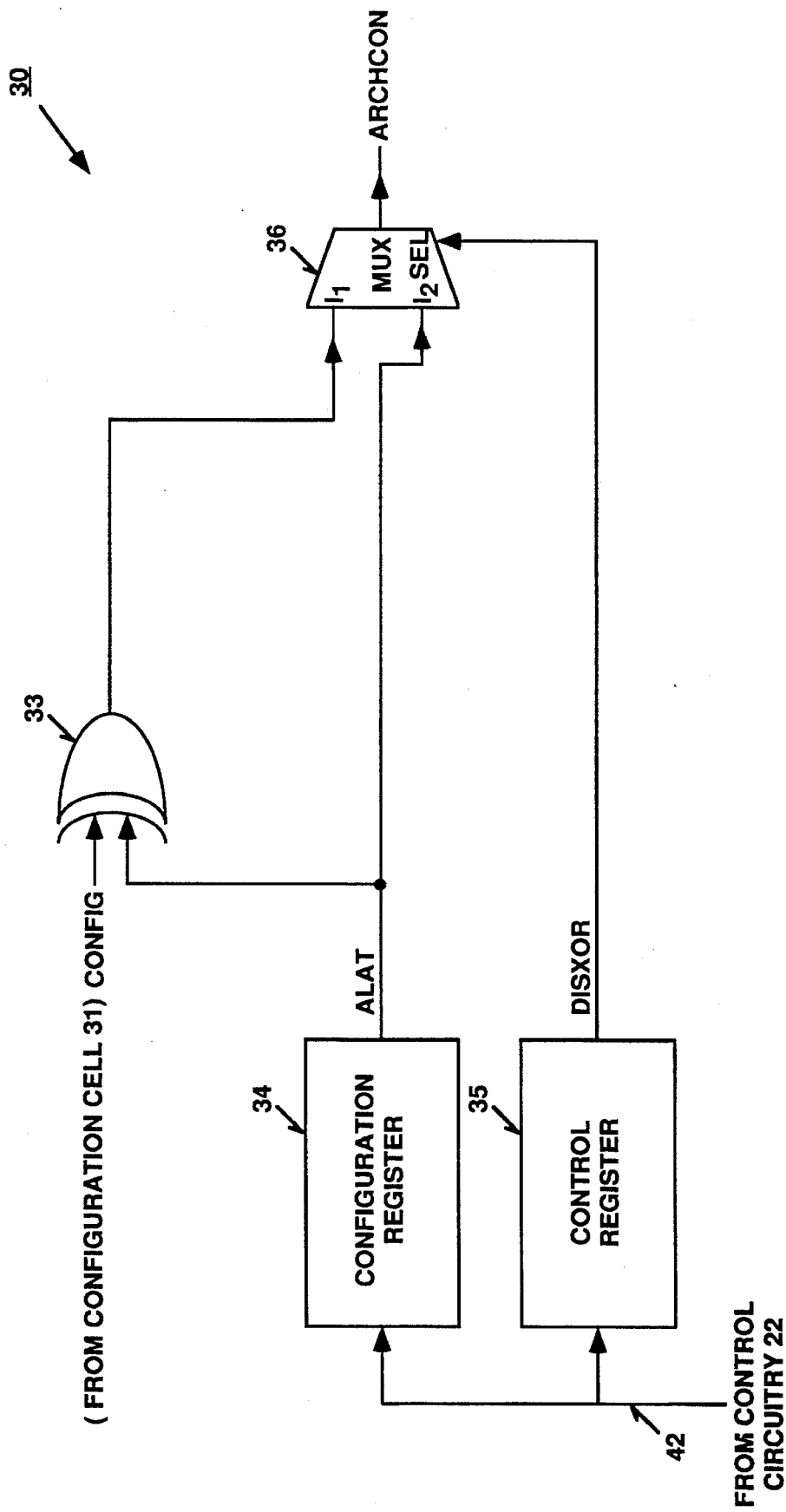
FIG. 2 illustrates in block diagram the circuitry of test configuration logic of FIG. 1.

FIG. 2 illustrates the circuitry of test configuration logic 30 of flash EPROM 20 of FIG. 1 in more detail. As shown in FIG. 2, test configuration logic 30 includes an exclusive OR gate 33 coupled to receive the CONFIG signal. Test configuration logic 30 also includes a configuration register 34. Configuration register 34 is used in test configuration logic 30 to store the temporary configuration information for flash EPROM 20. Configuration register 34 is, for one embodiment, a volatile register. Configuration register 34 generates an ALAT signal that is also applied as an input to exclusive OR gate 33. Configuration register 34 receives its configuration information from control circuitry 22 of FIG. 1 via line 42.

Test configuration logic 30 also includes a multiplexer 36 and a control register 35. Multiplexer 36 receives the output of exclusive OR gate 33 as an input. The other input of multiplexer 36 is the ALAT signal from configuration register 33. The output signal of multiplexer 36 is the ARCHCON signal. Control register 35 generates a DISXOR control signal to the select input SEL of multiplexer 36. Under the control of the DISXOR signal, multiplexer 36 selectively couples either the output of exclusive OR gate 33 or the ALAT signal from configuration register 34 to become the ARCHCON signal.

Configuration register 34 stores the temporary configuration information of flash EPROM 20. The temporary configure information is applied to configuration register 34 from control circuitry 22 (FIG. 1) via line 42. The ALAT signal represents the temporary configuration information stored in register 34. As described above, the ALAT signal is exclusive ORed with the CONFIG signal. The exclusive OR function of gate 33 allows the CONFIG signal to be temporarily overwritten or negated such that flash EPROM 20 can still be reconfigured after configuration cell 31 of FIG. 1 is programmed with the permanent configuration information. By using exclusive OR gate 33, the architecture of flash EPROM 20 can be changed without changing the programmed configuration information in configuration cell 31 (FIG. 1). This allows the test engineer to change the configuration of flash EPROM 20 during testing without involving reprogramming configuration cell 31.

Control register 35 stores the disable information to temporarily disable the CONFIG signal and causes the ALAT signal to become the ARCHCON signal. The disable information is written to control register 35 from control circuitry 22 of FIG. 1 via line 42. The DISXOR signal represents the disable information stored in control register 35. When the DISXOR signal is an active signal that causes multiplexer 36 to select the ALAT signal to be the ARCHCON signal, the disable information is stored in control register 35.

Referring to FIG. 3, as can be seen from the truth table, the ARCHCON signal is equal to the ALAT signal when the DISXOR signal is actively high. At this time, control register 35 of test configuration logic 30 stores the disable information and the CONFIG signal is disabled by test configuration logic 30. When the DISXOR signal is logically inactive low, the ARCHCON signal is the result of the CONFIG signal exclusive ORed with the ALAT signal. Exclusive OR gate 33 allows test configuration logic 30 to overwrite or negate the CONFIG signal without the DISXOR signal. In this situation, however, the test engineer needs to know the content programmed into configuration cell 31 (FIG. 1) and therefore the CONFIG signal.

As can be seen from FIG. 3, when the DISXOR signal is logically low and when the ALAT signal is logically inactive low, exclusive OR gate 33 outputs the CONFIG signal. When the ALAT signal is logically active high, the CONFIG signal is negated.

When the DISXOR signal is active, the output of exclusive OR gate 33 is disregarded and the ARCHCON signal follows the ALAT signal, as shown in FIG. 3.

In the foregoing specification, the invention has been described with reference to specific embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. A nonvolatile memory, comprising:
   (A) a configuration cell that stores a first configuration signal;
   (B) a configuration register that stores a second configuration signal that can be at one of a first and a second state;
   (C) a logic gate coupled to the configuration cell and the configuration register; and
   (D) a multiplexer that selectively couples an output of one of (1) the configuration register and (2) the logic gate to a control circuit of the nonvolatile memory, wherein when the multiplexer couples the output of the configuration register to the control circuitry, the nonvolatile memory is configured by the second configuration signal, wherein when the multiplexer couples the output of the logic gate to the control circuit and the second configuration signal is at the first state, the logic gate passes the first configuration signal to the control circuit to configure the nonvolatile memory, wherein when the multiplexer couples the output of the logic gate to the control circuit and the second configuration signal is at the second state, the logic gate alters the first configuration signal without reprogramming the configuration cell and passes an altered first configuration signal to the control circuit to configure the nonvolatile memory, wherein the configuration cell, the configuration register, the logic gate, and the multiplexer all reside on the same chip as the memory.

2. The nonvolatile memory of claim 1 further comprising a control register coupled to the multiplexer that controls the multiplexer to selectively couple the output of (1) the configuration register and (2) the logic gate to the control circuit.

3. The nonvolatile memory of claim 1, wherein configuration register is a volatile register, wherein the configuration cell is an electrically programmable and erasable read only memory cell.

\* \* \* \* \*